US012587198B2

(12) United States Patent
Zeinolabedinzadeh et al.

(10) Patent No.: US 12,587,198 B2
(45) Date of Patent: Mar. 24, 2026

(54) FAST TRACKING PLL WITH ANALOG MIXER FOR PHASE DETECTION

(71) Applicant: ARIZONA BOARD OF REGENTS ON BEHALF OF ARIZONA STATE UNIVERSITY, Scottsdale, AZ (US)

(72) Inventors: Saeed Zeinolabedinzadeh, Chandler, AZ (US); Matthew Kinsinger, Phoenix, AZ (US); Waleed Ahmad, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 50 days.

(21) Appl. No.: 18/714,338

(22) PCT Filed: Nov. 30, 2022

(86) PCT No.: PCT/US2022/080682

§ 371 (c)(1),
(2) Date: May 29, 2024

(87) PCT Pub. No.: WO2023/102439

PCT Pub. Date: Jun. 8, 2023

(65) Prior Publication Data

US 2025/0023571 A1    Jan. 16, 2025

Related U.S. Application Data

(60) Provisional application No. 63/284,333, filed on Nov. 30, 2021.

(51) Int. Cl.
H03L 7/087      (2006.01)
H03L 7/081      (2006.01)
H03L 7/093      (2006.01)

(52) U.S. Cl.
CPC .............. *H03L 7/087* (2013.01); *H03L 7/081* (2013.01); *H03L 7/093* (2013.01)

(58) Field of Classification Search
CPC .......... H03L 7/087; H03L 7/081; H03L 7/093
See application file for complete search history.

(56) References Cited

U.S. PATENT DOCUMENTS

| 10,965,250 B1 * | 3/2021 | Kruiskamp | .............. H03B 5/36 |
| 2003/0031267 A1 * | 2/2003 | Hietala | ................. H04L 25/062 |
| | | | 375/295 |

(Continued)

OTHER PUBLICATIONS

International Search Report and Written Opinion dated Mar. 8, 2023, PCT Application No. PCT/US2022/080682, 11 pages.

(Continued)

*Primary Examiner* — Janice N Tieu
(74) *Attorney, Agent, or Firm* — MH2 Technology Law Group LLP

(57) ABSTRACT

A fast-tracking phase-locked-loop (PLL) with an analog mixer for phase detection and correction is provided. A frequency lock loop architecture as described herein is used for a PLL that can lock the phase of a local oscillator to an input reference signal of arbitrarily high frequency, even if the local oscillator and the input reference signal frequencies are originally very far apart. To accommodate arbitrarily high frequency input reference signals, embodiments use an analog mixer for the phase detector, rather than a phase-frequency detector (PFD). The analog mixer can be designed to operate on input signals with frequencies of 10's of GHz, whereas the PFD is limited to input frequencies of less than 1 GHz. Embodiments use a new architecture utilizing the concept of Hartley Image Rejection receiver architecture in a frequency lock loop, which enables the PLL to adjust the local oscillator frequency to be brought within the frequency locking range of the analog mixer.

18 Claims, 16 Drawing Sheets

(56)                    References Cited

U.S. PATENT DOCUMENTS

| | | |
|---|---|---|
| 2003/0035503 A1 | 2/2003 | Sanduleanu |
| 2006/0057996 A1* | 3/2006 | Petrovic ................. H03D 3/007 |
| | | 455/260 |
| 2006/0193401 A1* | 8/2006 | Lopez Villegas ... H04L 27/2276 |
| | | 375/329 |
| 2008/0130780 A1 | 6/2008 | Cho et al. |
| 2018/0048045 A1 | 2/2018 | Kikuchi et al. |
| 2021/0028789 A1 | 1/2021 | Kuan et al. |

OTHER PUBLICATIONS

Lee, "High-Speed Circuit Designs for Transmitters in Broadband Data Links," IEEE Journal of Solid-State Circuits, vol. 41, Issue 5, May 2006, pp. 1004-1015.
Behbahani et al., CMOS Mixers and Polyphase Filters for Large Image Rejection, IEEE Journal of Solid-State Circuits, vol. 36, No. 6, Jun. 2001, pp. 873-887.
Kang et al., A W-Band Low-Noise PLL With a Fundamental VCO in SiGe for Millimeter-Wave Applications, IEEE Transactions on Microwave Theory and Techniques, vol. 62, No. 10, Oct. 2014, pp. 2390-2404.

* cited by examiner

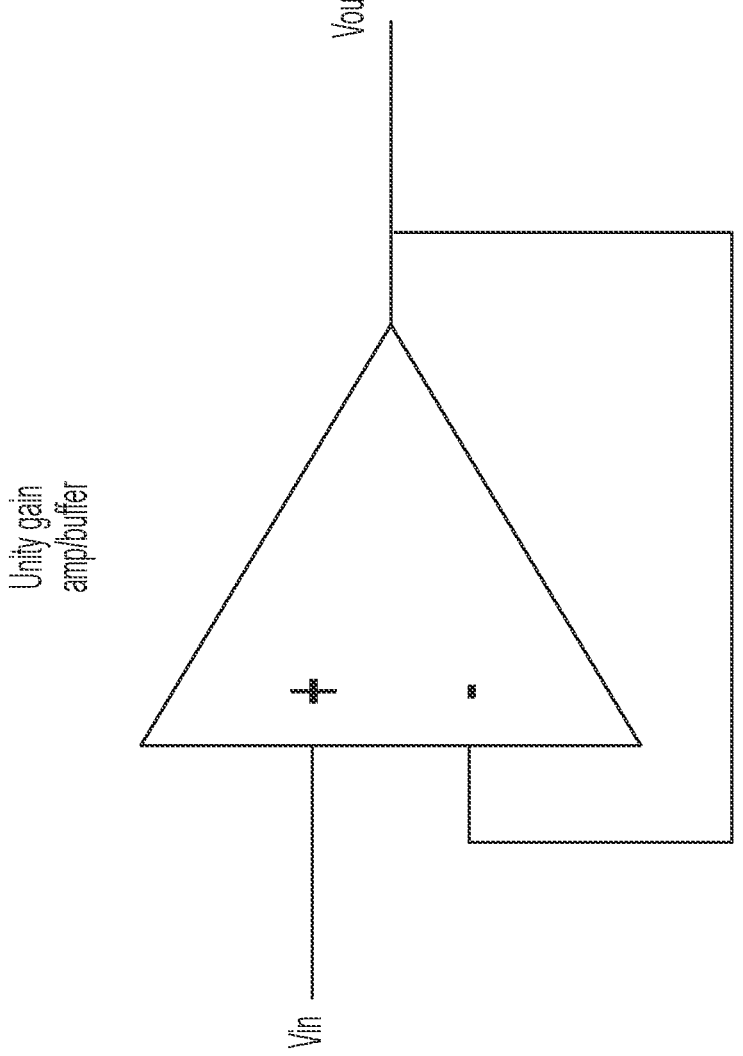
Unity gain amp/buffer
Vin
Vout
FIG. 4

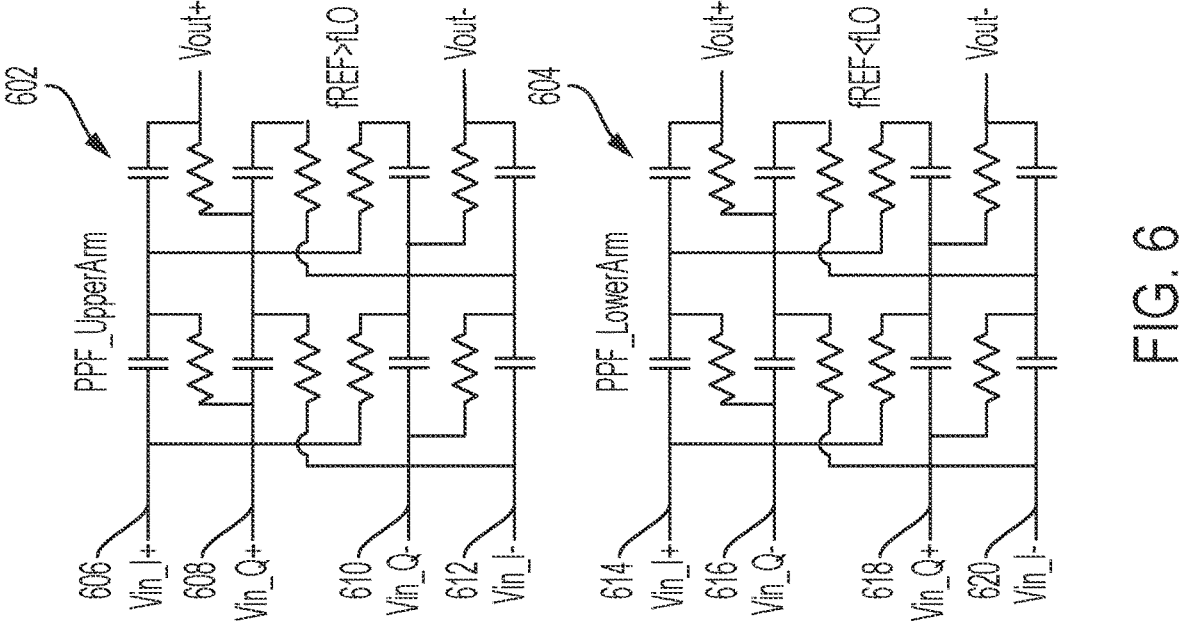
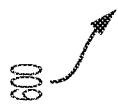
FIG. 6

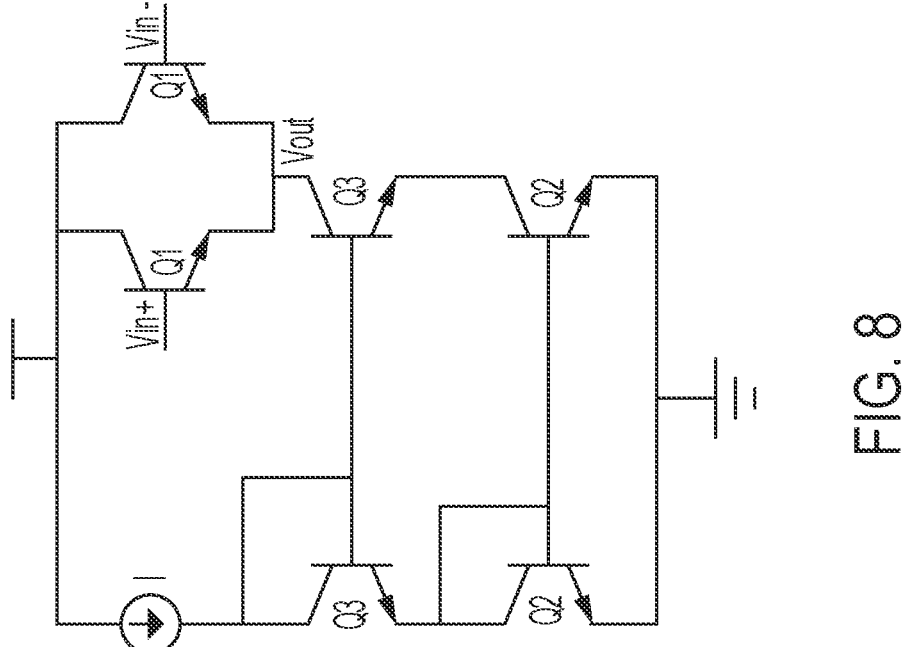
FIG. 8

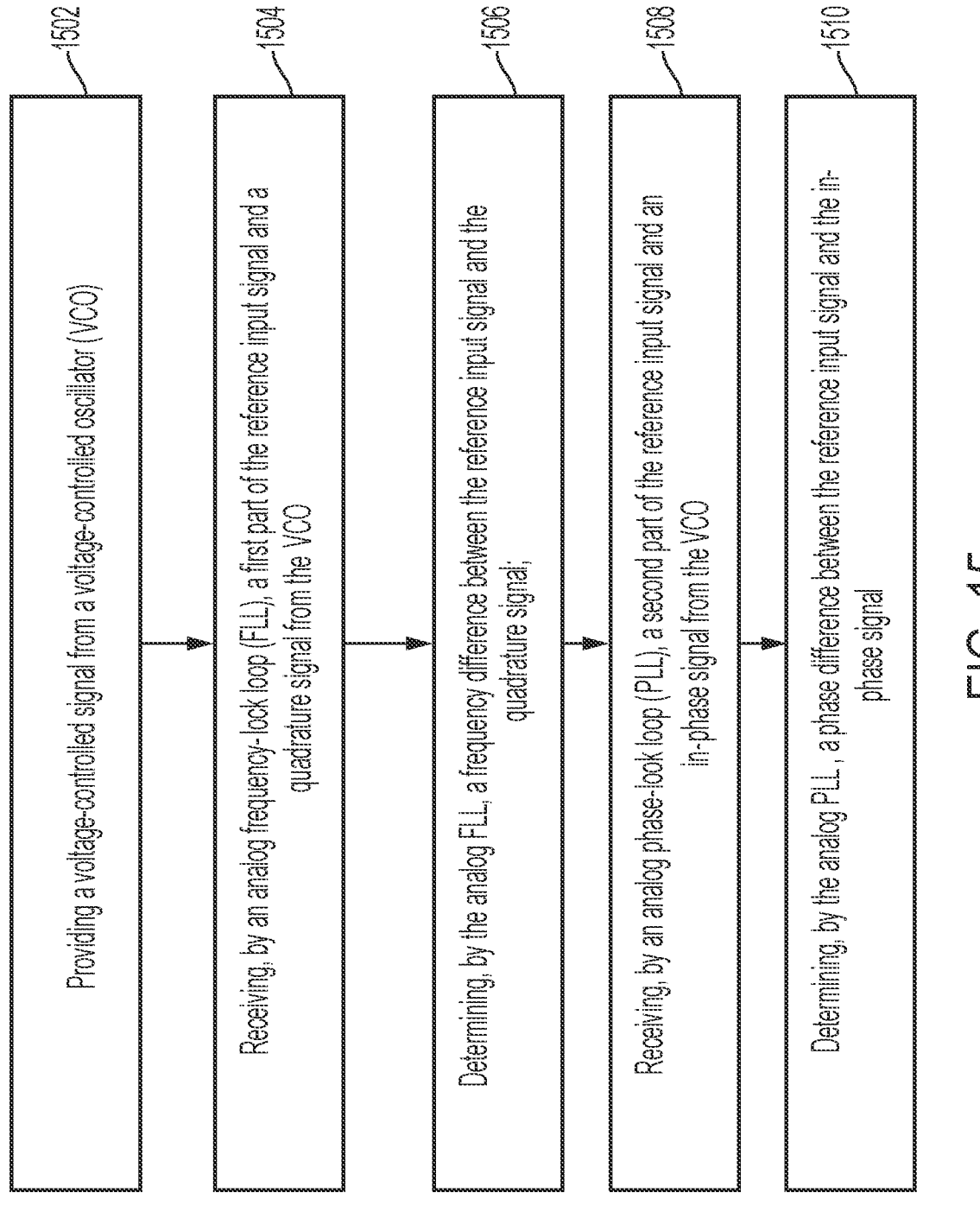

1500

1502 Providing a voltage-controlled signal from a voltage-controlled oscillator (VCO)

1504 Receiving, by an analog frequency-lock loop (FLL), a first part of the reference input signal and a quadrature signal from the VCO 1506 Determining, by the analog FLL, a frequency difference between the reference input signal and the quadrature signal;

1508 Receiving, by an analog phase-lock loop (PLL), a second part of the reference input signal and an in-phase signal from the VCO 1510 Determining, by the analog PLL, a phase difference between the reference input signal and the in-phase signal

FIG. 15

FAST TRACKING PLL WITH ANALOG MIXER FOR PHASE DETECTION

CROSS-REFERENCE TO RELATED APPLICATIONS

This application is the national stage entry of International Patent Application No. PCT/US2022/080682, filed on Nov. 30, 2022, which claims priority to U.S. Provisional Application Ser. No. 63/284,333, filed on Nov. 30, 2021, the disclosure of which is hereby incorporated by reference in its entirety.

GOVERNMENT SUPPORT

This invention was made with government support under HR00112010012 awarded by the Defense Advanced Research Projects Agency (DARPA). The government has certain rights in the invention.

FIELD OF THE DISCLOSURE

The present disclosure relates wireless communications, radar, imaging, and photonics.

BACKGROUND

When transmitting and receiving electromagnetic signals, systems and devices need to be able to match the frequencies and the phases of both the received signal and a locally generated signal. In terms of signal to noise ratio (SNR), the alignment of the phases gives the best results for retrieving any data that is modulated on the received signal. Better SNR yields higher accuracy results for applications such as wireless communications, radar ranging, imaging, and photonics.

SUMMARY

A fast-tracking phase-lock-loop (PLL) for phase and frequency detection and synchronization is provided. A frequency lock loop architecture as described herein is used for a PLL that can lock the phase of a local oscillator to an input reference signal of arbitrarily high frequency, even if the local oscillator and the input reference signal frequencies are originally very far apart. To accommodate arbitrarily high frequency input reference signals, embodiments use an analog mixer for the phase detector, rather than a phase-frequency detector (PFD). The analog mixer can be designed to operate on input signals with frequencies of 10's of GHz, whereas the PFD is limited to input frequencies not more than 1 GHz. Embodiments use the modified concept of Hartley Image Rejection receiver architecture in a frequency locked loop that enables the PLL to determine the direction in which the local oscillator frequency needs to be adjusted to be brought within the frequency locking range of the analog mixer PLL.

According to examples of the present disclosure, a system for synchronizing a phase and a frequency of a reference input signal is disclosed. The system comprises a voltage-controlled oscillator (VCO); an analog frequency-lock loop (FLL) configured to receive a first part of the reference input signal and a quadrature signal from the VCO and to determine a frequency difference between the reference input signal and the quadrature signal; and an analog phase-look loop (PLL) configured to receive a second part of the reference input signal and an in-phase signal from the VCO and to determine a phase difference between the reference input signal and the in-phase signal.

Various additional features can be included in the system including one or more of the following features. The PLL comprises an analog PLL mixer configured to output signals to a PLL operational transconductance amplifier (OTA). The PLL OTA outputs a signal to a loop filter that changes a VCO frequency or a phase of the quadrature signal or the in-phase signal produced by the VCO. The analog FLL is configured to determine a direction in which a frequency of the quadrature signal or the in-phase signal produced by the VCO is adjusted to be brought within a frequency locking range of the analog mixer PPL. The reference input signal has a frequency range between about a few MHz to thousands of THz frequencies. The analog FLL comprises a first buffer, a first poly-phase filter, a first power detector, a first integrator, and a first comparator. The analog FLL comprises a second buffer, a second poly-phase filter, a second power detector, a second integrator, and a second comparator. The analog FLL comprises a FLL OTA that is configured to receive signals from the first integrator, the first comparator, the second integrator, and the second comparator and to provide a FLL OTA output signal to a loop filter. The loop filter provides a loop filter output signal to the VCO to control operation of the VCO. The PLL is configured to perform binary shift keying (BPSK) data demodulation after the PLL is locked.

According to examples of the present disclosure, a method for matching a phase and a frequency of a reference input signal is disclosed. The method comprises providing a voltage-controlled signal from a voltage-controlled oscillator (VCO); receiving, by an analog frequency-lock loop (FLL), a first part of the reference input signal and a quadrature signal from the VCO; determining, by the analog FLL, a frequency difference between the reference input signal and the quadrature signal; receiving, by an analog phase-look loop (PLL), a second part of the reference input signal and an in-phase signal from the VCO; and determining, by the analog PLL, a phase difference between the reference input signal and the in-phase signal.

Various additional features can be included in the method including one or more of the following features. The PLL comprises an analog PLL mixer that outputs signals to a PLL operational transconductance amplifier (OTA). The PLL OTA outputs a PLL OTA signal to the VCO to change a frequency or a phase of the quadrature signal or the in-phase signal produced by the VCO. The method further comprises determining a direction, by the analog FLL, in which a frequency of the quadrature signal or the in-phase signal produced by the VCO is adjusted to be brought within a frequency locking range of the analog mixer PPL. The reference input signal can be an optical signal having a frequency range between about 100 GHz to about 1000 GHz. In the example of an optical signal, a photodetector can also be used instead of a Gilbert mixer as a phase detector for optical frequencies. The reference input signal has a frequency 300 GHz to about 3000 GHz. The analog FLL comprises a first buffer, a first poly-phase filter, a first power detector, a first integrator, and a first comparator. The analog FLL comprises a second buffer, a second poly-phase filter, a second power detector, a second integrator, and a second comparator. The analog FLL comprises a FLL OTA that is configured to receive signals from the first integrator, the first comparator, the second integrator, and the second comparator and to provide a FLL OTA output signal to a loop filter. The method further comprises providing a loop filter output signal by the loop filter to the VCO to control operation of the VCO.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4 is a schematic diagram of an exemplary unity gain buffer that shields the mixer output from the low impedance loading effect of the poly-phase filter according to examples of the present disclosure.

FIG. 6 is a schematic diagram of an exemplary poly-phase filter block used in the frequency lock loop according to examples of the present disclosure.

FIG. 8 is a schematic diagram of an exemplary power detector circuit according to examples of the present disclosure.

FIG. 15 shows a method for matching a phase and a frequency of a reference input signal according to examples of the present disclosure.

DETAILED DESCRIPTION

Figure 1:
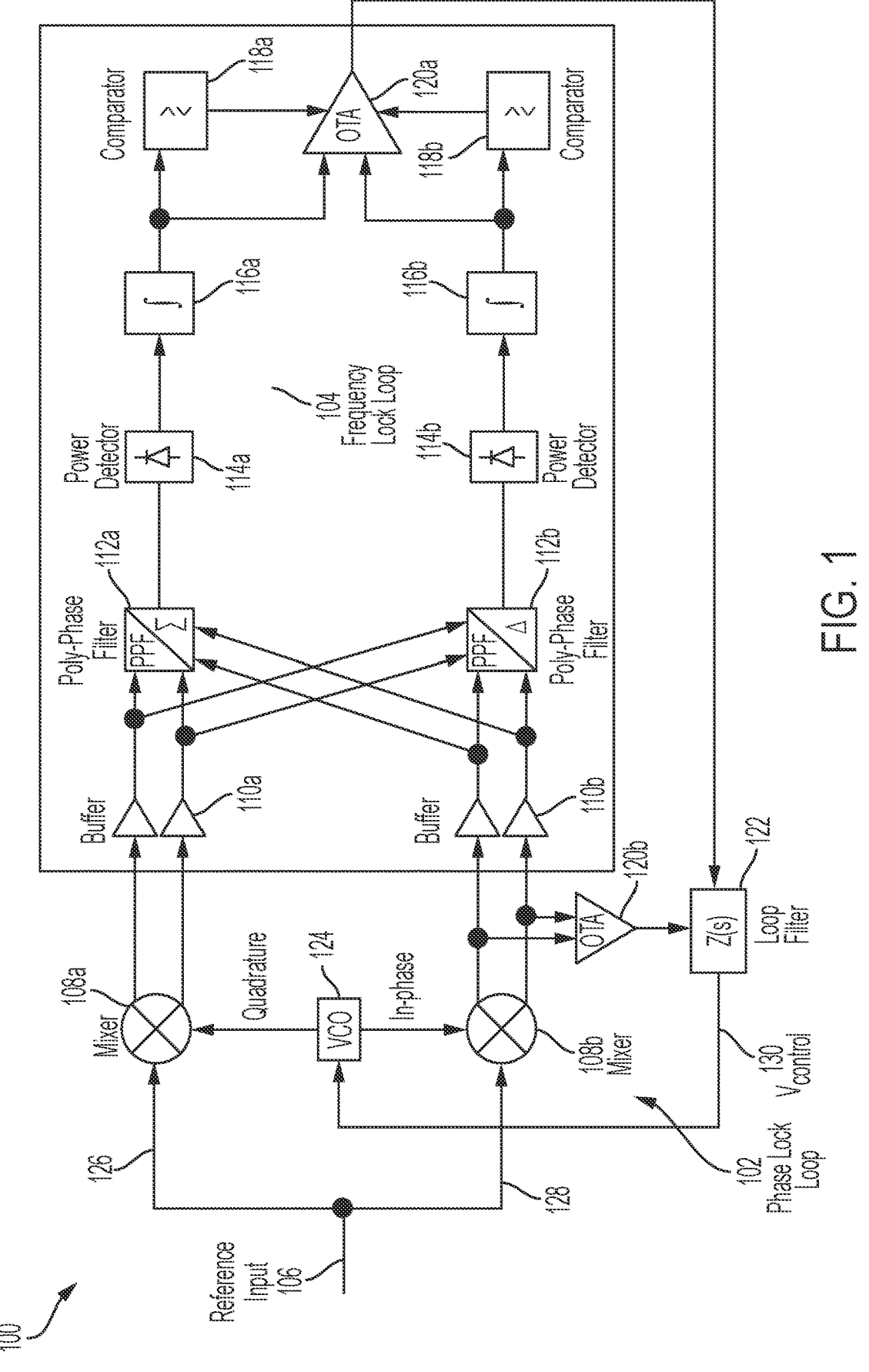
FIG. 1 is a block schematic diagram of a phase lock loop (PLL) circuit architecture according to examples described herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A fast-tracking phase-lock-loop (PLL) with an analog mixer for phase detection is provided. A frequency lock loop architecture as described herein is used for a PLL that can lock the phase of a local oscillator to an input reference signal of arbitrarily high frequency, even if the local oscillator and the input reference signal frequencies are originally very far apart. To accommodate arbitrarily high frequency input reference signals, embodiments use an analog mixer for the phase detector, rather than a phase-frequency detector (PFD). The analog mixer can be designed to operate on input signals with frequencies of 10's of GHz, whereas the PFD is limited to input frequencies of less than 1 GHz depending on the used technology. Embodiments use the concept of modified Hartley Image Rejection architecture in a frequency lock loop that enables the PLL to determine the direction in which the local oscillator frequency needs to be adjusted to be brought within the frequency locking range of the analog mixer PLL.

I. Introduction

A new architecture for a PLL is described herein. The purpose is to have a PLL that can lock the phase of the local oscillator to an input reference signal of arbitrarily high frequency, even if the input reference and the local oscillator are initially at frequencies that can be as far apart as several GHz. Standard PLLs use a Phase-Frequency Detector (PFD) made of digital circuits and are limited to input signals with frequencies of less than 1 GHz depending on the used technology. This has two major drawbacks.

First, the traditional PLL closed loop bandwidth is limited to less than 1/10th of the input reference frequency which would limit the bandwidth of the PLL. Some examples of limitations that this places on an application are the transient response of the PLL, rate of phase locking, rate at which data can be successfully modulated and de-modulated in a wireless communications system, or the bandwidth over which a radar system can function. Hence, traditional systems have a data rate limitation in communications, or a bandwidth limitation in radar systems. This limits the precision at which phase information can be extracted from a signal for radar ranging or imaging applications.

Second, the traditional PLL requires frequency divider circuits to bring its input signals down to the frequency of the reference with frequencies below 500 MHz-1 GHz. These add both power consumption, phase noise, and complexity to the PLL.

The PLL architecture described herein uses an analog mixer to perform phase detection. Generally, it has not been possible for an analog mixer PLL to successfully lock the phases of two input signals if they are not already "sufficiently close" in frequency. Sufficiently close is defined by the frequency locking range of the PLL. For example, it has been shown that an analog mixer phase detector PLL might have a frequency locking range of 80 MHz for a 28 GHz input signal. If the local oscillator and the input reference signal frequencies are initially further apart than this range, the PLL will not lock their phases.

The reason for wanting to use an analog mixer for the phase detector is that the allowable input signal frequencies are limited only by the technology of the devices used to build the analog mixer. With current circuit technology processes, analog mixers can be designed to handle input frequencies of 10's of GHz and above 100 GHz. This means that the PLL can operate directly on signals of arbitrarily high frequencies. There is no need for frequency divider circuits, and the limitation on the closed loop bandwidth of the PLL is no longer limited by the operation frequency of PFD. This PLL can also be used in optical applications where the signal frequencies are hundreds of THz by utilizing the same concept of the modified Hartley Image Rejection architecture and using photo detector instead of transistor-based phase detector.

Embodiments described herein provide a new type of frequency lock loop that works in parallel to the PLL and enables the frequency locking range of the PLL to be increased to several GHz or more. This new architecture enables the frequency locking for higher frequency signals including optical signals where the initial frequency offset between the local source and the reference is high (e.g., such that conventional architectures are unable to establish phase locking due to insufficient frequency locking range). The frequency lock loop uses concepts from a modified Hartley Image Rejection architecture and applies them in a new way to move the frequency of a VCO in the desired direction.

This architecture can be designed to enable a receiver to cancel out the image frequency. The frequency lock loop takes advantage of this ability to distinguish between higher and lower frequencies. The frequency lock loop can determine simultaneously if the input reference signal is outside of the frequency locking range of the PLL, and automatically adjust the frequency of the local oscillator in the correct direction (up or down) until it is brought within the frequency locking range of the PLL. The frequency lock loop works in parallel to the phase lock loop. It turns itself ON when needed, and OFF when a task is complete. It does this using only the input reference and local oscillator signals without the need of any external measurement or control signals.

II. PLL Architecture

FIG. 1 is a block schematic diagram of PLL circuit architecture 100 according to embodiments described herein. PLL circuit architecture comprises phase lock loop (PLL) 102 and frequency lock loop (FLL) 104. Reference input signal 106 is split into first reference 126 signal and second reference signal 128 and are provided to mixers 108a and 108b. Mixer 108a mixes first reference signal 126 with a quadrature signal from voltage-controlled oscillator (VCO) 124. Mixer 108b mixes second reference signal 128 with an in-phase signal from VCO 124. Output signals from mixer 108a are provided to buffer 110a and output signals from mixer 108b are provided to buffer 110b. Poly-Phase filter 112a receives signals from buffer 110a and 110b and outputs a signal to power detector 114a. Poly-Phase filter 112b receives signals from buffer 110b and 110a and outputs a signal to power detector 114b. Power detector 114a outputs a signal to integrator 116a and power detector 114b outputs a signal to integrator 116b. Integrator 116a and 116b outputs a signal to comparator 118a and 118b, respectively, and to operational transconductance amplifier (OTA) 120a. Comparator 118a and 118b also outputs a respective signal to OTA 120a. OTA 120a outputs a signal to loop filter, Z(s), 122. Loop filter 122 outputs a voltage-controlled signal 130 to VCO 124. Mixer 108b also outputs a signal to OTA 120b, which then outputs a signal to loop filter 122.

An exemplary aspect described herein focuses on operation of frequency lock loop 104 and how it enables the PLL to have a frequency locking range of order GHz as opposed to just MHz. Mixers 108a and 108b with quadrature oscillator inputs followed by poly-phase filter 112a and 112b enable sideband separation (i.e., lower sideband and upper sideband) for operation of the frequency lock loop 104 operation. The arrows connecting any two blocks represent physical metal connections for electro-magnetic signals to propagate from one block to the next.

A. Design Details

One non-limiting example of the PLL uses input signals at 28 GHz frequency. However, the disclosed PLL circuit can be designed for higher frequencies and is limited only by the frequency limitation of the CMOS or BiCMOS technology or any other technology being used. Design of VCO 124 and mixers 108a and 108b enable the PLL to be used with input signals of any frequency. Various circuit designs may be used for mixer 108a and 108b and VCO 124. In one non-limiting example, a double balanced active mixer (Gilbert Cell) can be used as mixer 108a and 108b and a Colpitts voltage-controlled oscillator can be used as VCO 124. In some examples, mixer 108a and 108b have differential outputs.

Figure 2:
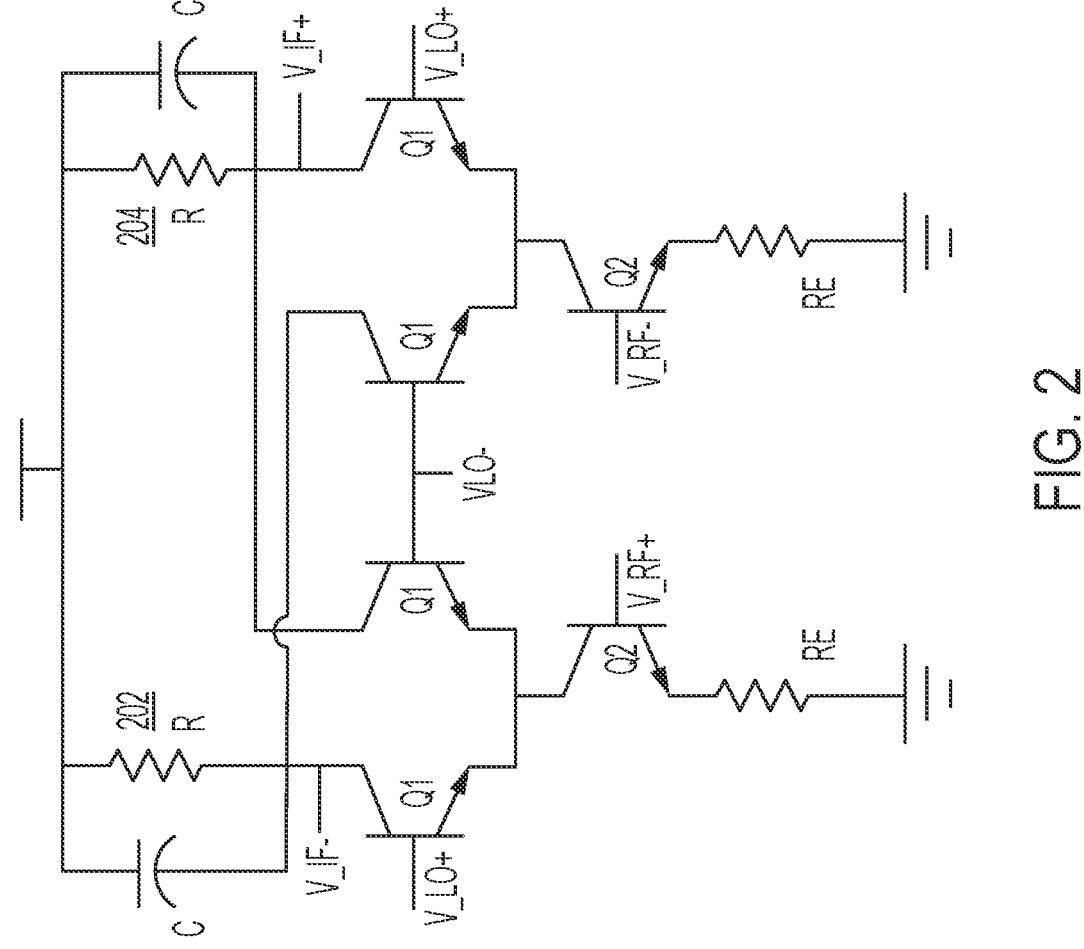
FIG. 2 is a schematic diagram of an exemplary double-balanced mixer used as the phase detector for the PLL of FIG. 1 according to examples of the present disclosure.

FIG. 2 is a schematic diagram of an exemplary double-balanced mixer 200 that can be used as mixer 108a and 108b for the PLL 102 of FIG. 1. The double-balanced mixer 200 is a Gilbert Cell mixer with differential inputs and outputs. Emitter resistors 202 and 204 are added to the reference input devices to control the gain and improve the linearity of the mixer. The design specifications of mixer 108a and 108b and VCO 124 affect the performance of the PLL 102. For example, the frequency tuning of VCO 124 with respect to control signal voltage and the DC output voltage of mixer 108a and 108b with respect to the input phase difference of the reference input signal 106 and signals from VCO 124 when they have the same frequency are both useful parameters for the PLL 102 loop stability. Output frequency of mixer 108a and 108b at which the gain of the mixer drops by 3 dB is also a useful parameter for loop stability. This represents a pole in the PLL 102 open loop transfer function that affects the phase margin of the PLL 102. Thus, the design of mixer 108a and 108b and VCO 124 are to be considered in implementation and can be implemented in a number of ways as will be appreciated by one of skill in the art.

PLL 102 comprises in-Phase VCO signal from VCO 124, mixer 108b, OTA 120b, loop filter Z(s) 122, and control signal from VCO 124 is an analog mixer PLL. When the frequencies of input reference signal 106 and signals from VCO 124 are within the frequency locking range of PLL 102 then FLL 104 is disabled, as discussed below. In this case, only the PLL 102 is operational. Specifications such as PLL 102 stability and PLL 102 closed loop bandwidth are a function of the parameters of each circuit component in this loop. Various circuit designs for PLL 102 can be used in the various examples of the present disclosure.

In one non-limiting example, the FLL 104 enables PLL 102 to have a frequency locking range on the order of GHz as opposed to just MHz and will be discussed in detail here. Note that while the design of each circuit in FLL 104 is configured to provide a satisfactory overall performance of FLL 104, the design of any individual component can vary. The design of these circuits can be adjusted and optimized for subsequent iterations of PLL 102, and for varying specifications that are required for a given application. FLL 104 acts on input signals whose frequency is equal to the frequency difference of input reference signal 106 and signals of VCO 124 that are inputs to mixers 108a and 108b.

Figure 3:
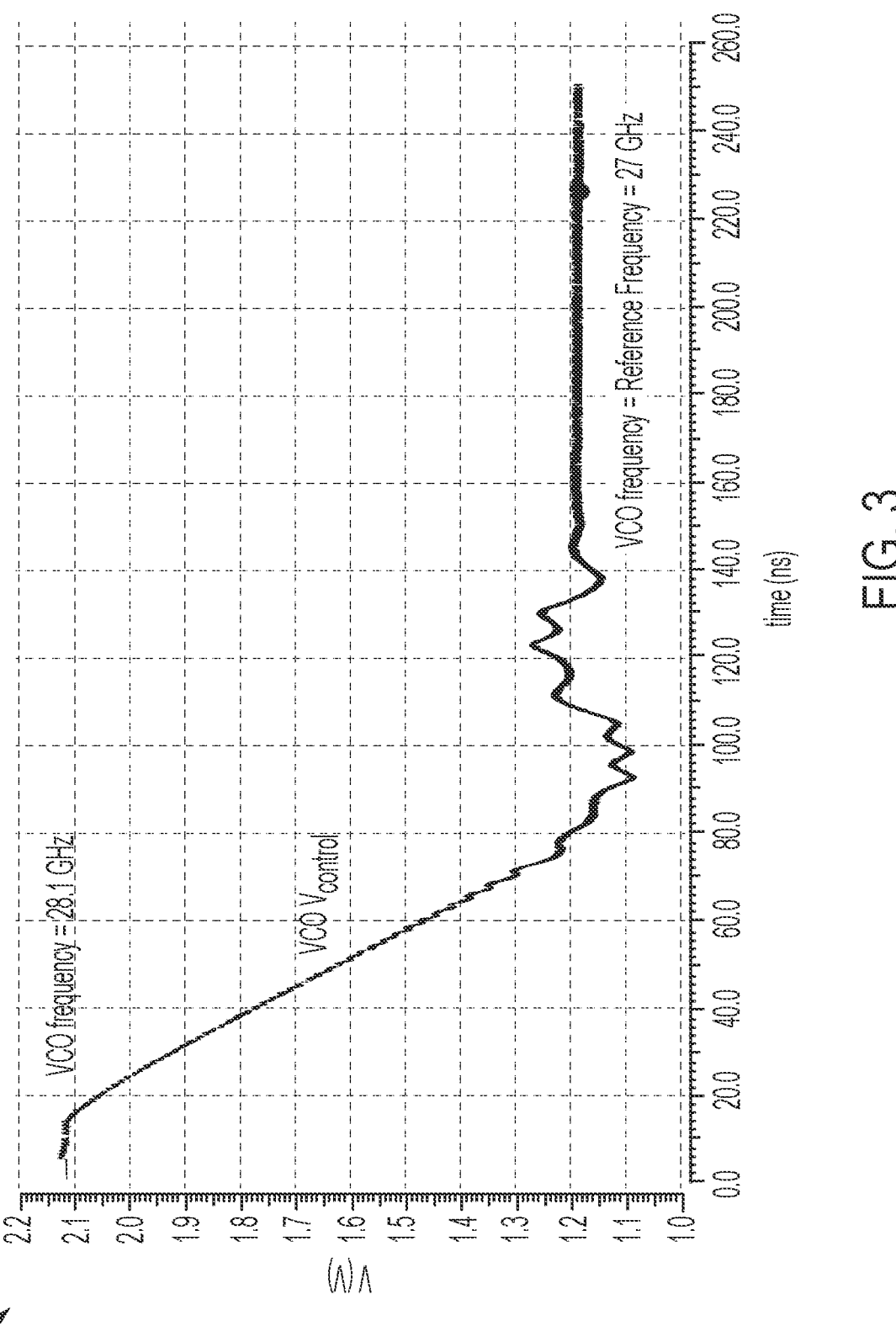
FIG. 3 is a graphical representation of a simulation plot illustrating functionality of the PLL according to examples of the present disclosure.

FIG. 3 is a graphical representation of a simulation plot 300 illustrating functionality of the PLL 102 according to examples of the present disclosure. The frequency of the signal produced by VCO 124 can begin at 28.1 GHz, while the input reference signal 106 has a frequency of 27 GHz. In this example, this frequency difference of 1.1 GHz is well outside the nominal 80 MHz frequency locking range of the phase loop alone. The operation of FLL 104 brings the frequency of the signal produced by VCO 124 down to 27 GHz and then shuts OFF. Then PLL 102 takes over and locks the phases (and frequencies) of input reference signal 106 and VCO 124. This shows the successful operation of the frequency lock loop described herein.

Mixers 108a and 108b have differential signals as outputs. These differential signals are used for the sideband separation (i.e., lower sideband and upper sideband) done by poly-phase filters 112a and 11b. Buffers 110a and 110b are not needed for the operation of FLL 104, but they are needed to prevent poly-phase filters 112a and 112b of FLL 104 from presenting a low impedance to PLL 102. This low impedance can cause two problems. First, the mixer gain drops substantially as the mixer output frequency is increased. If the mixer gain is too low, then the subsequent circuits in FLL 104 will not produce sufficiently large enough control signals to drive FLL 104. Second, this impedance creates a pole in PLL 102 and adversely affects the stability and the achievable closed loop bandwidth of PLL 102, which are performance metrics for PLL 102.

FIG. 4 is a schematic diagram of an exemplary unity gain buffer 400 that shields the mixer output from the low impedance loading effect of the poly-phase filters 112a and 112b according to examples of the present disclosure. The specific buffer design may vary but should have a high buffer input impedance. For example, the impedance looking into the gate of a MOSFET, or the base of a SiGe HBT (Silicon-Germanium Heterojunction Bipolar Transistor) device or any other type of active device used for the design, is high. In one non-limiting example, buffer 110a and 110b can be a unity gain OTA with SiGe HBT inputs.

Figure 5:
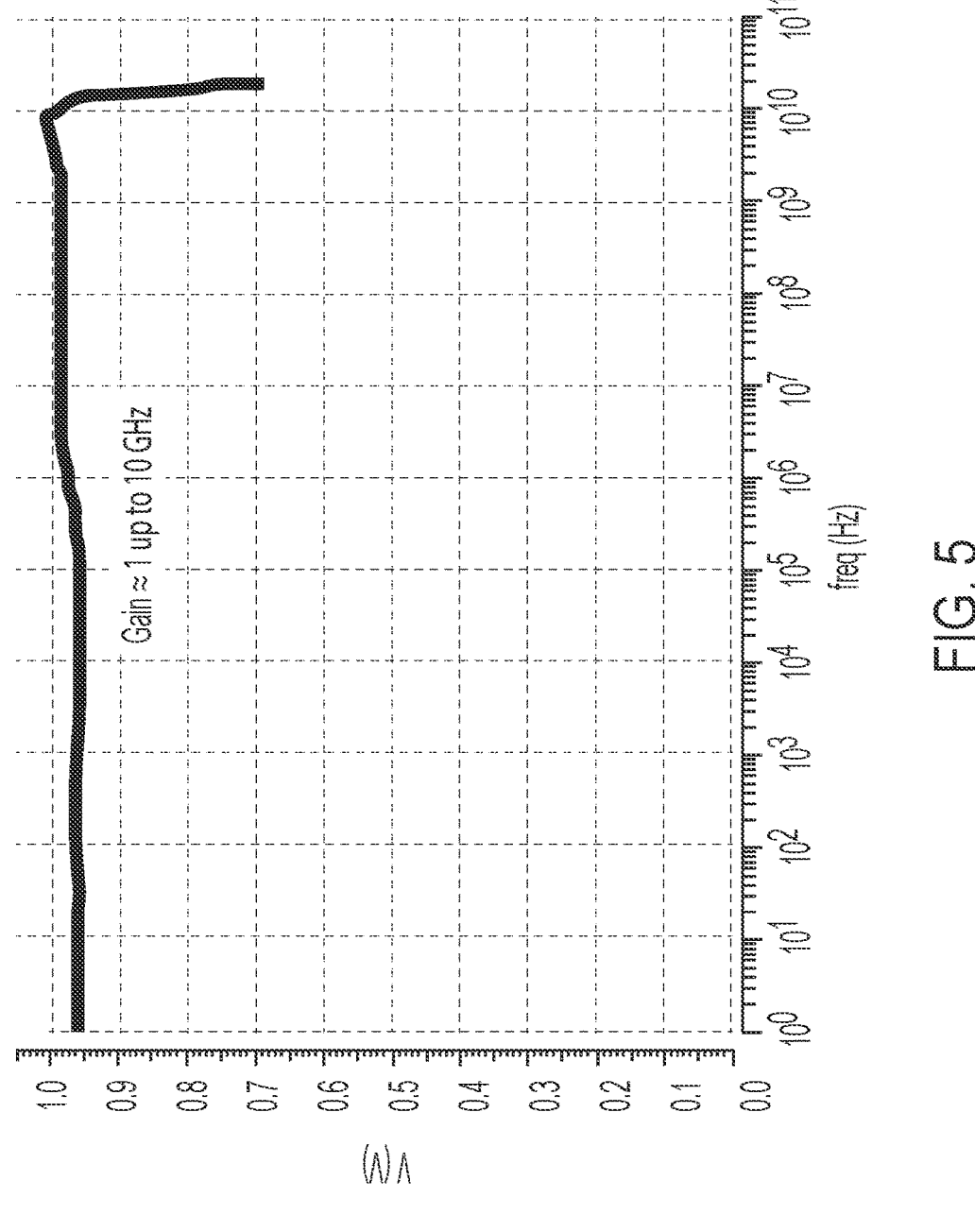
FIG. 5 is a graphical representation of the frequency response of the mixer output buffer from FIG. 4 according to examples of the present disclosure.

FIG. 5 is a graphical representation of the frequency response (e.g., gain) 500 of the mixer output buffer from FIG. 4. This shows that the gain of the buffer circuit is approximately equal to unity up to a frequency of 10 GHz. Thus, the buffer design can enable the frequency lock loop to function as expected up to mixer output frequencies (or equivalently the frequency difference of the input reference signal 106 and the VCO 124) of 10 GHz.

FIG. 6 is a schematic diagram of an exemplary poly-phase filter block 600, i.e., poly-phase filter 112a and 112b, used in FLL 104 according to examples of the present disclosure. The poly-phase filter block 600 is of note to the performance of FLL 104. When a poly-phase filter is used for sideband separation and image rejection, multiple stages can be included to increase the effective operating bandwidth over which satisfactory image rejection performance can be obtained. In non-limiting examples of the present disclosure, poly-phase filter 112a and 112b comprise two stages, namely stages 602 and 604. Poly-phase filter 112a and 112b have different responses for positive and negative frequencies, and it is this characteristic that we are taking advantage of. Using the poly phase filter 112a and 112b, a summation and subtraction of upper channel (upper arm of FIG. 1) and lower channel (lower arm in FIG. 1) is performed. This operation separates the lower sideband and upper sidebands and helps in detecting either the frequency of the input reference is higher than the local VCO 124 or it is lower.

In some examples, each stage of poly-phase filter 112a and 112b comprises resistors and capacitors that are connected as shown in the schematics of FIG. 6. In one non-limiting example, poly-phase filter 112a and 112b have 1/RC=900 MHz and 300 MHz. This is obtained with R=150 Ohms, C=1.18 pF for the first stage of 900 MHz, and R=200 Ohms, C=2.68 pF for the second stage of 300 MHz. Each poly-phase filter 112a and 112b has four inputs which are the differential outputs of both the In-Phase and Quadrature mixers, i.e., mixer 108b and mixer 108a, respectively. Namely, the inputs for PFF_UpperArm 602 is Vin_I+ 606, Vin_Q+ 608, Vin_Q– 610, and Vin_I– 612 and the inputs for PPF_LowerArm 604 is Vin_I+ 614, Vin_Q– 616, Vin_Q+ 618, and Vin_I– 620. In one non-limiting example, only two of the outputs of each poly-phase filter 112a and 112b are used. The difference polarities cause each poly-phase filter to either pass or attenuate signals depending on whether the reference input frequency is above or below the VCO frequency.

As can be seen in FIG. 6, it is the arrangement of the inputs to the poly-phase filters 112a and 112b that determines whether it will reject mixer 108a and 108b outputs when the reference input signal 106 is either above or below the VCO 124 signal. In one non-limiting example, the upper-arm (lower-arm) poly-phase has a gain of unity when the reference input signal 106 frequency is higher (lower) than the frequency of the VCO 124 signal, and a gain of zero when the reference input signal 106 frequency is lower (higher) than the frequency of the VCO 124.

Figure 7:
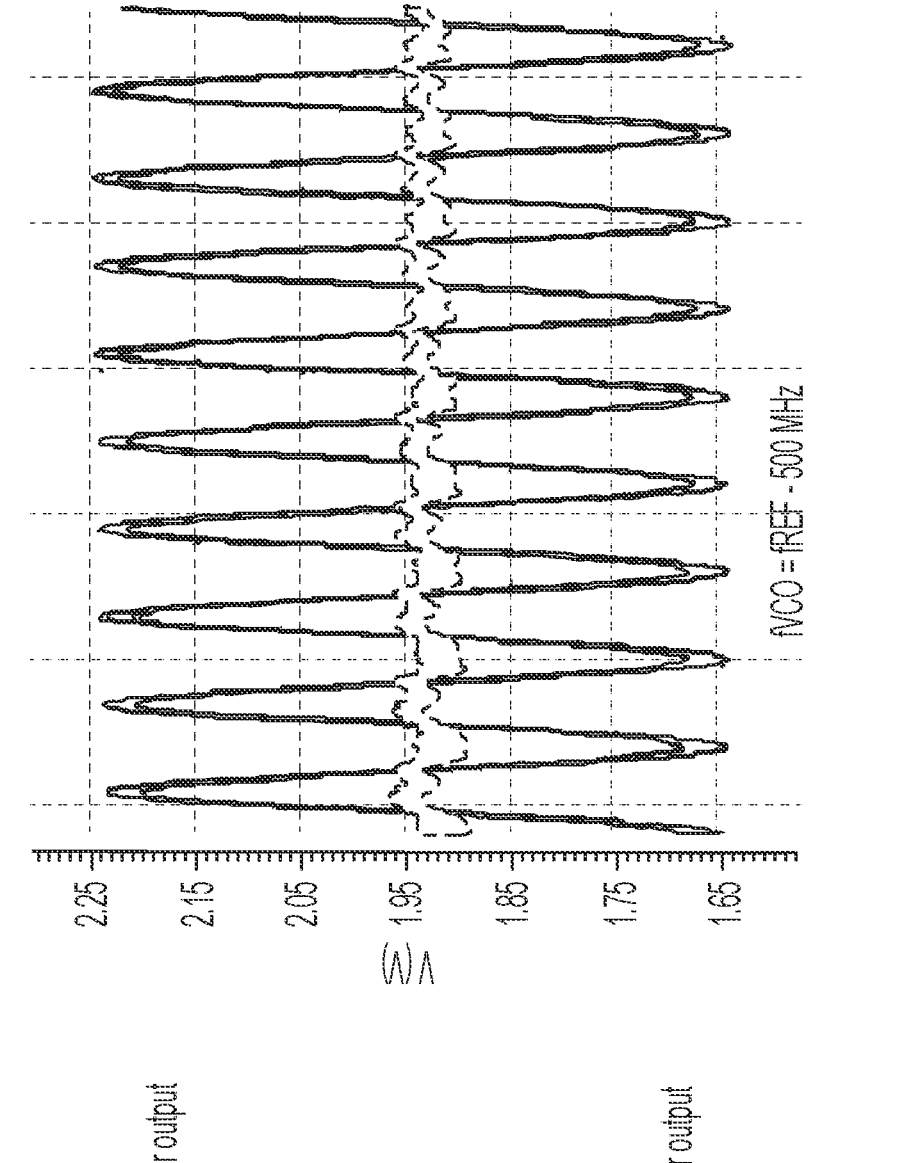
FIG. 7 is a graphical representation of outputs of the upper-arm and lower-arm poly-phase filters of FIG. 6 when the reference frequency is 500 MHz higher than the VCO frequency according to examples of the present disclosure.

FIG. 7 is a graphical representation 700 of outputs of the upper-arm and lower-arm poly-phase filters 112a and 112b of FIG. 6 when the reference frequency is 500 MHz higher than the VCO 124 frequency. Notice that the upper-arm poly-phase filter output 702 is highly attenuated, and the lower-arm poly-phase filter output 704 is a clean sinusoidal signal with differential peak-peak amplitude of 600 mV. This is equivalent to 1.2 Vpp single ended. This difference in amplitude is used by the FLL 104 for controlling the direction in which the VCO 124 control signal should be adjusted. In this example, the RMS value of the output of the lower-arm poly-phase filter (signal) would be extracted and used to bring the VCO 124 frequency lower to meet the frequency of the reference input signal 106.

Each poly-phase filter 112a and 112b has differential outputs. These outputs are used as inputs to a power detector circuit, i.e., power detector 114a and 114b. The power detector 114a and 114b provide a measure of the amplitude of the signals that are coming out of each poly-phase filter 112a and 112b, respectively. For example, if the reference input signal 106 has a frequency of 28 GHz, and the VCO 124 frequency is at 27.5 GHz, then the poly-phase filter 112a of the upper branch might have an output signal with frequency 500 MHz and amplitude of 1 V. The lower branch poly-phase filter 112b will have an output also of 500 MHz, but with amplitude of 0.1 V. This is due to the image-rejection that the poly-phase filters 112a and 112b enact. In some examples, the lower branch (the branch with poly-phase filter 112b) would have an output with amplitude of 0 Volts, but due to imperfect image-rejection its output will have a small amplitude.

FIG. 8 is a schematic diagram of an exemplary power detector circuit 800, i.e., power detector 114a and 114b, according to examples of the present disclosure. Power detector 114a and 114b extract a DC value that is proportional to the RMS value of its respective input signal. In one non-limiting example, power detector 114a and 114b can be implemented as a simple differential input pair. The output is taken from the shared source terminal of the input devices (Q1) ad output is taken from the shared node Vout. Q2 and Q3 are part of the current mirror. The signal at this node is a rectified signal at double the frequency of the input signals, and approximately half the amplitude. The DC root-mean-square (RMS) value of these rectified power detector outputs are extracted using a simple RC low-pass filter (integrator).

Figure 9:
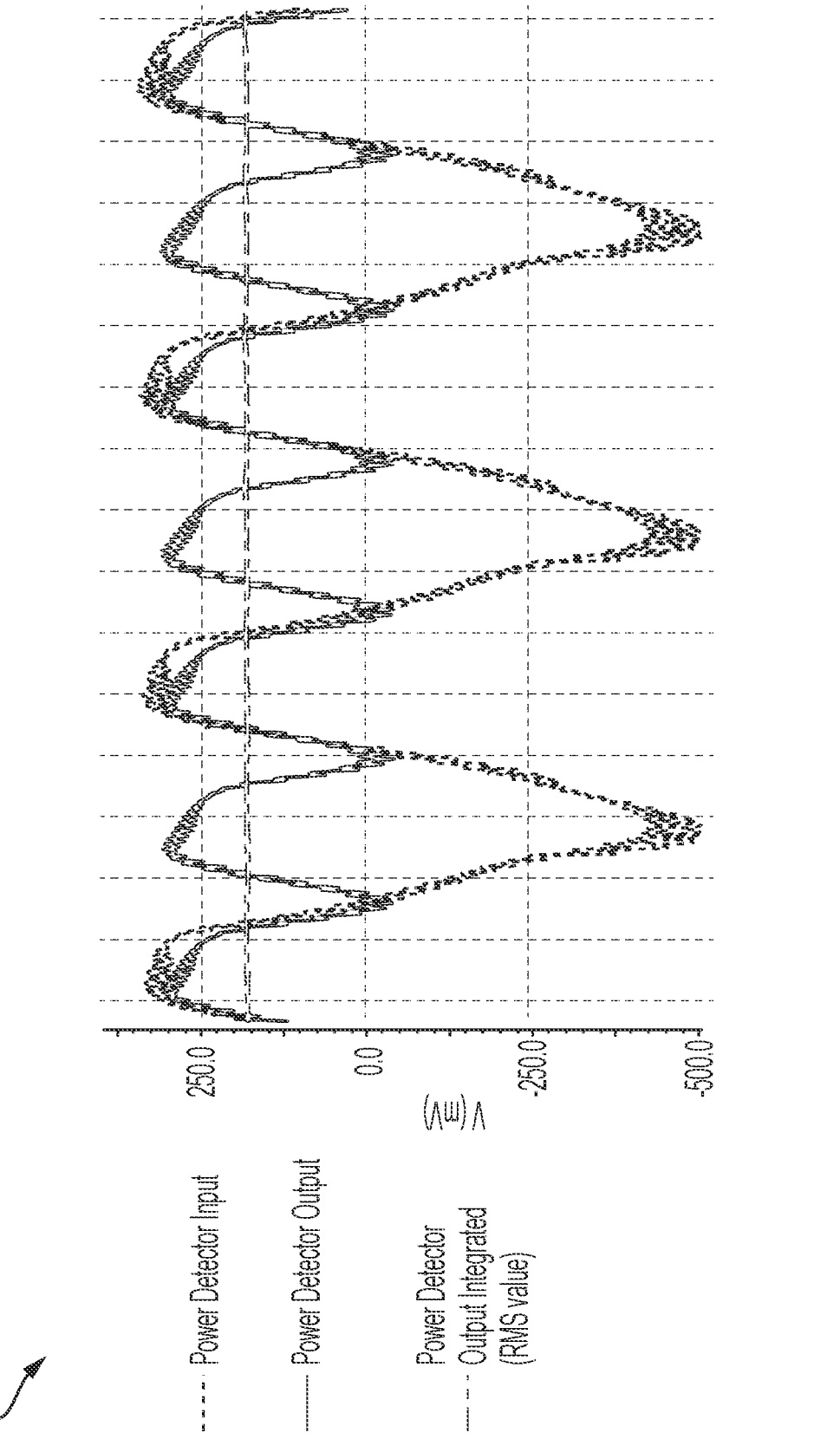
FIG. 9 is a graphical representation of input and output signals of the power detector as well as the output of the RC low-pass filter integration according to examples of the present disclosure.

FIG. 9 is a graphical representation 900 of input and output signals of power detector 114a and 114b as well as the output of the RC low-pass filter integration, i.e., integrator 116a and 116b, according to examples of the present disclosure. The RC values are design parameters that satisfy the tradeoff between settling time and lowpass filter bandwidth.

The next stages of FLL 104 see DC signals for inputs; thus the RC are selected to be large enough so that higher frequency ripples are attenuated and not passed onto the next stage. However, the RC low-pass filter is selected to settle to the RMS value of the power detector, i.e., power detector 114a and 144b, outputs as quickly as possible. This fast settling is selected for two reasons:

1) FLL 1104 is implemented to react quickly to frequency differences of reference input signal 106 and VCO 124 signals so that the frequencies can be brought together as quickly as possible.

2) When the frequencies are brought close enough to be within the frequency locking range of PLL 102, FLL 104 shutoff mechanism (described later) is implemented to shut off FLL 104 fast enough so that is doe not overshoot and take the frequencies out of PLL 102 frequency locking range in the opposite direction. If FLL 104 does not react quickly enough, this process of frequency overshoot could repeat indefinitely and PLL 102 may never settle.

Another aspect of the power detector circuit, i.e., power detector 114a and 114b, is the DC de-coupling capacitor at the input that serves two purposes. First, it enables the selection of the desired DC bias voltage of power detector 114a and 114b input devices. Second, this capacitor along with the resistor used for the DC biasing of the input devices functions as a high-pass filter. This high-pass filter can be tuned to approximately 100 MHz, which is slightly higher than the 80 MHz frequency locking range of PLL 102. The purpose of this is to bring the outputs of power detectors 114a and 114b back towards their nominal DC operating points as soon as FLL 104 has brought the VCO 124 frequency within the frequency locking range of PLL 102. As will be explained below, when both power detector 114a and 114b outputs are at the nominal DC operating point, the control signals for FLL 104 force FLL 104 to "shut off." This lets PLL 102 take over to lock the phase of the VCO 124 and reference input signals 106 without interference from FLL 104.

Figure 10:
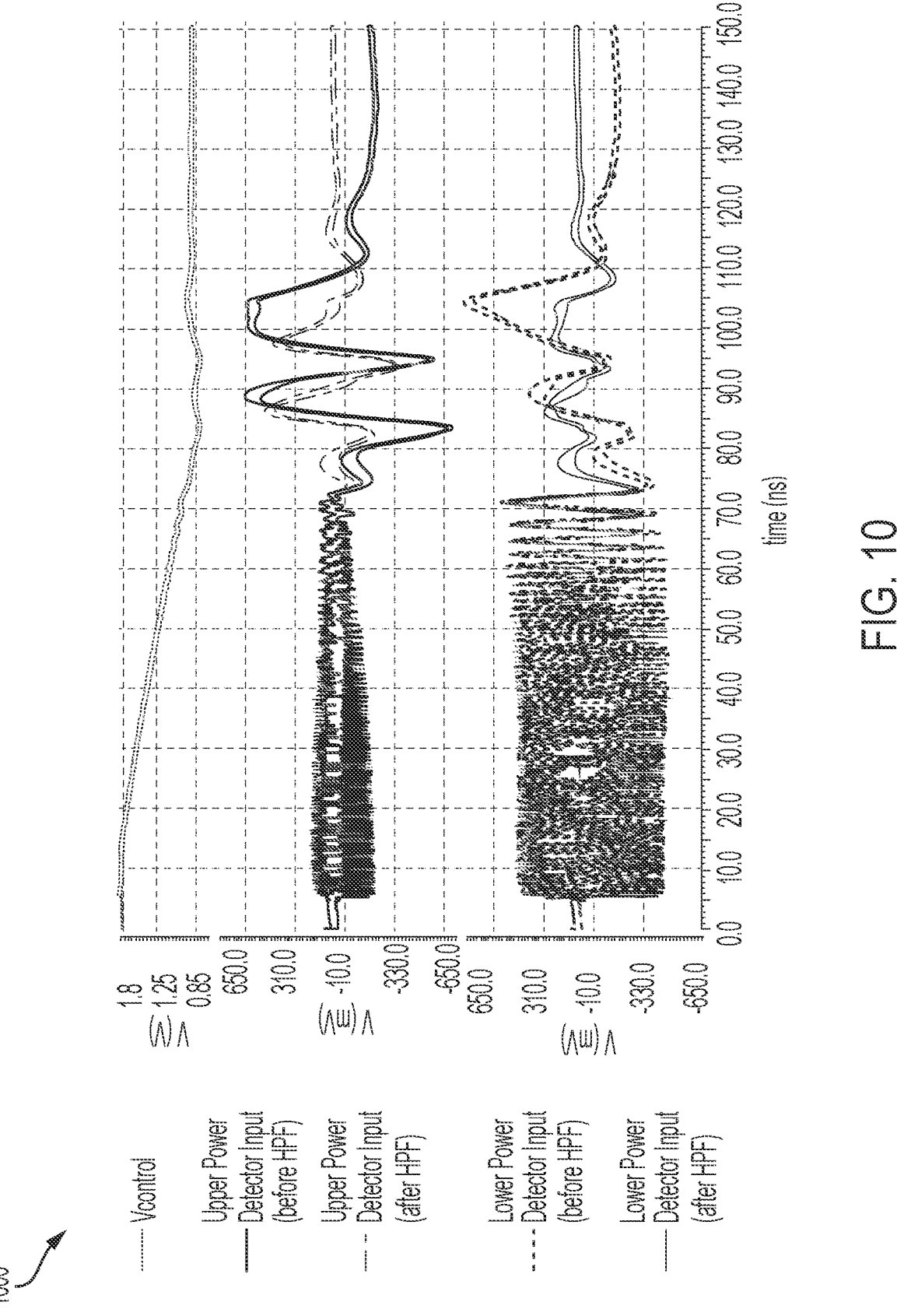
FIG. 10 is a graphical representation showing the effect of the high-pass filter (HPF) at the input to the power detectors according to examples of the present disclosure.

FIG. 10 is a graphical representation 1000 showing the effect of the high-pass filter (HPF) at the input to the power detectors, i.e., power detectors 114a and 114b, according to examples of the present disclosure. This transient simulation plot shows the region in which FLL 104 is shut off, along with the time domain signals at the input to the power detectors, i.e., power detectors 114a and 114b, after passing through the high-pass filter. When FLL 104 is operating, one of the power detectors will have a larger output amplitude than the other. This will be transformed by the integrator to give a DC voltage for both the upper and lower arms of FLL 104. These signals are sent to a differential input OTA for adjusting the control voltage of the VCO 124, and to a comparator, i.e., comparator 118a or 118b, that is used to generate control signals for shutting off FLL 104. Both of these actions are described in more detail below.

Figure 11:
FIG. 11 is a schematic diagram of an operational transconductance amplifier (OTA) at the end of the frequency lock loop according to examples of the present disclosure.

FIG. 11 is a schematic diagram of an operational transconductance amplifier (OTA) 1100, i.e., OTA 120a, at the end of FLL 104 according to examples of the present disclosure. OTA 120a senses which of these signals is larger in value. This voltage difference at the input is converted to an output current that either charges or discharges the loop filter capacitors, i.e., loop filter 122. For example, if the reference input has a frequency of 28 GHz, while the VCO 124 frequency is at 27.5 GHz, then the upper channel power detector, i.e., power detector 114a, output will be larger than the lower channel. This voltage difference at the input to OTA 120a will cause the output current of OTA 120a to have a net outflow of some 100's of micro-Amperes.

In FIG. 11, the PMOS devices provide the DC bias current to the input pair devices and the rest of the OTA 120a. The top device labelled Mbias 1102 sets the level of the DC bias current. The next devices labelled Mcontrol 1104 are used to turn on/off the DC bias current to the OTA 120a. When the gate of Mbias 1102 and Mcontrol 1104 are at VDD, the DC bias current to the OTA 120a is zero (turned off). If either of the Mbias 1102 or Mcontrol 1104 has a gate voltage of 0 V, then the DC bias current is allowed to flow to the input pair devices and the rest of the OTA 120a (turned on). This is how the frequency lock loop is enabled/disabled.

Figure 12:
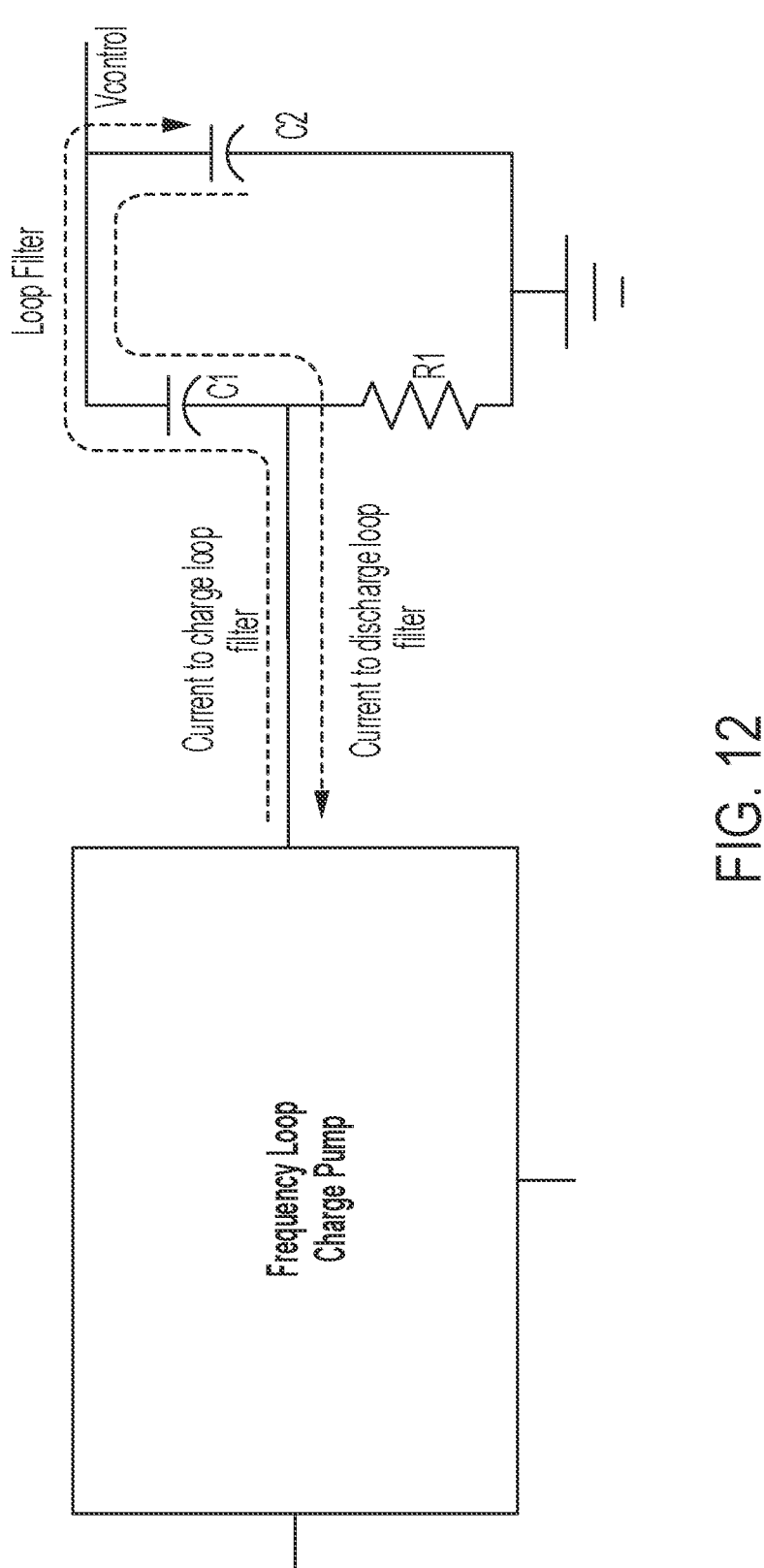
FIG. 12 is a schematic diagram of the frequency loop OTA and loop filter according to examples of the present disclosure.

FIG. 12 is a schematic diagram of the frequency loop OTA 1200, i.e., 120a, and loop filter, i.e., loop filter 122, according to examples of the present disclosure. OTA 120a of FLL 104 can have a net outflow (inflow) of current when OTA 120a positive input is greater than (less than) the negative input. It is through OTA 120a that FLL 104 acts on the control signal of the VCO 124. When the r capacitor of loop filter 122, C2, is charged (discharged), VCO 124 frequency increases (decreases). The voltage across the capacitor C2 of loop filter 122 is the control voltage of the VCO 124. Thus, the frequency of the VCO 124 will increase (decrease) until it is equal to the frequency of the input reference signal 106. The loop filter is a $2^{nd}$ order circuit that comprises C1, C2, and R1.

Comparators 118a and 118b are used to turn on and shut off FLL 104. When the reference input signal 106 and the VCO 124 frequencies are within the frequency locking range of PLL 102, PLL 102 is shut off and does not interfere with the operation of PLL 102. When the frequencies of the reference input signal 106 and VCO 124 are outside of this frequency locking range, FLL 104 is turned on and VCO 124 frequency is brought to within the frequency locking range of PLL 102. The way FLL 102 is turned on/off is through the DC bias current of OTA 120a.

In FIG. 11, the PMOS device is labeled, Mcontrol 1104, that is used as a turn on or shut off the DC bias current of OTA 120a of FLL 104. Without any DC bias current, OTA 120a will not be able to create any net inflow or outflow of current and will not affect the value of the voltage across capacitor of loop filter 122. When the gate voltage of this biasing device is at VDD=4V, the device is in cutoff and now current flows. The DC bias current through this device is mirrored over to the output of OTA 120a. Thus, no current flowing through the bias device means there is no current at the output of OTA 120a. Likewise, a gate voltage of 0 V on this bias device turns the device on and enables DC current to flow. The DC bias current value is set by the top bias device labelled Mbias 1102 in FIG. 11.

In FIG. 12, the frequency loop OTA 120a will have a net outflow (inflow) of current when the OTA 120a positive input is greater than (less than) the negative input. It is through this OTA 120a that the FLL 104 acts on the control signal of the VCO 124. When the loop filter capacitor, C2, is charged (dis-charged), the VCO 124 frequency increases (decreases).

Figure 13:
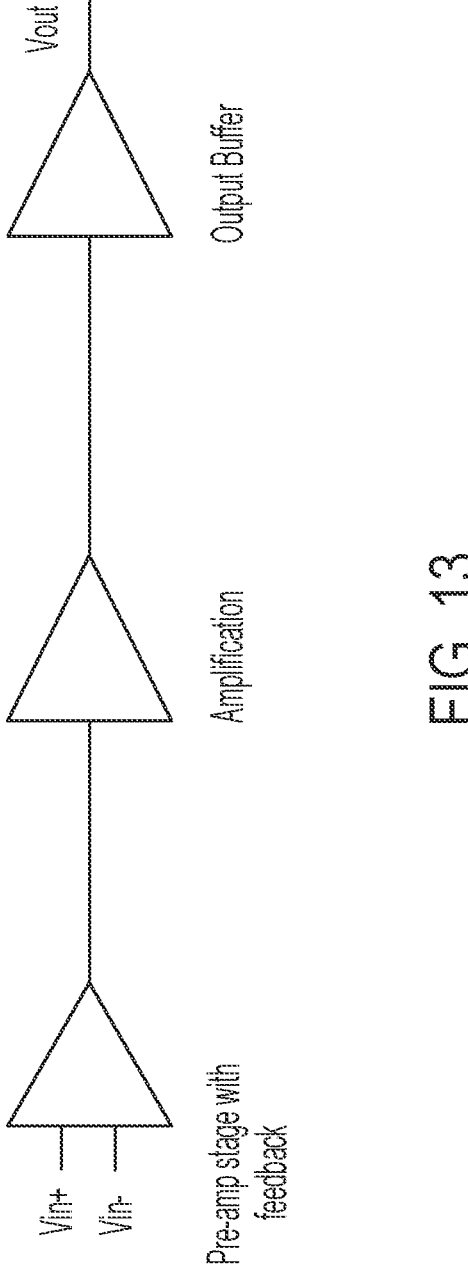
FIG. 13 is a schematic diagram of an exemplary comparator circuit according to examples of the present disclosure.

FIG. 13 is a schematic diagram of an exemplary comparator circuit 1300, i.e., comparator 118a and 118b, according to examples of the present disclosure. The comparator circuit 1300 implementation can vary according to embodiments described herein. The comparator input reference voltage can be set to about 40 mV above the DC operating voltage of the power detector output. This reference voltage is applied to the positive input of the comparator, thus when the power detector outputs are between the nominal DC operating point and 40 mV above this value the output of the comparator is VDD=4V. The comparator outputs are connected to one of the DC bias control devices described in the previous paragraph. When the comparator outputs are high (VDD), OTA 120a of FLL 104 is shut off. If the reference input signal 106 and the VCO 124 frequency difference is larger than approximately 80 MHz, then one of the integrated power detector outputs will become higher than the comparator input reference voltage. This will force the comparator output to drop to 0 V, turning on the Mcontrol device 1104, and letting the DC bias current flow through OTA 120a of FLL 104. The preamp stage is used to amplify the power detector outputs and a feedback circuitry is included to get rid of DC offsets. The last stage in FIG. 13 is the inventor circuit to output the digital signal.

Figure 14:
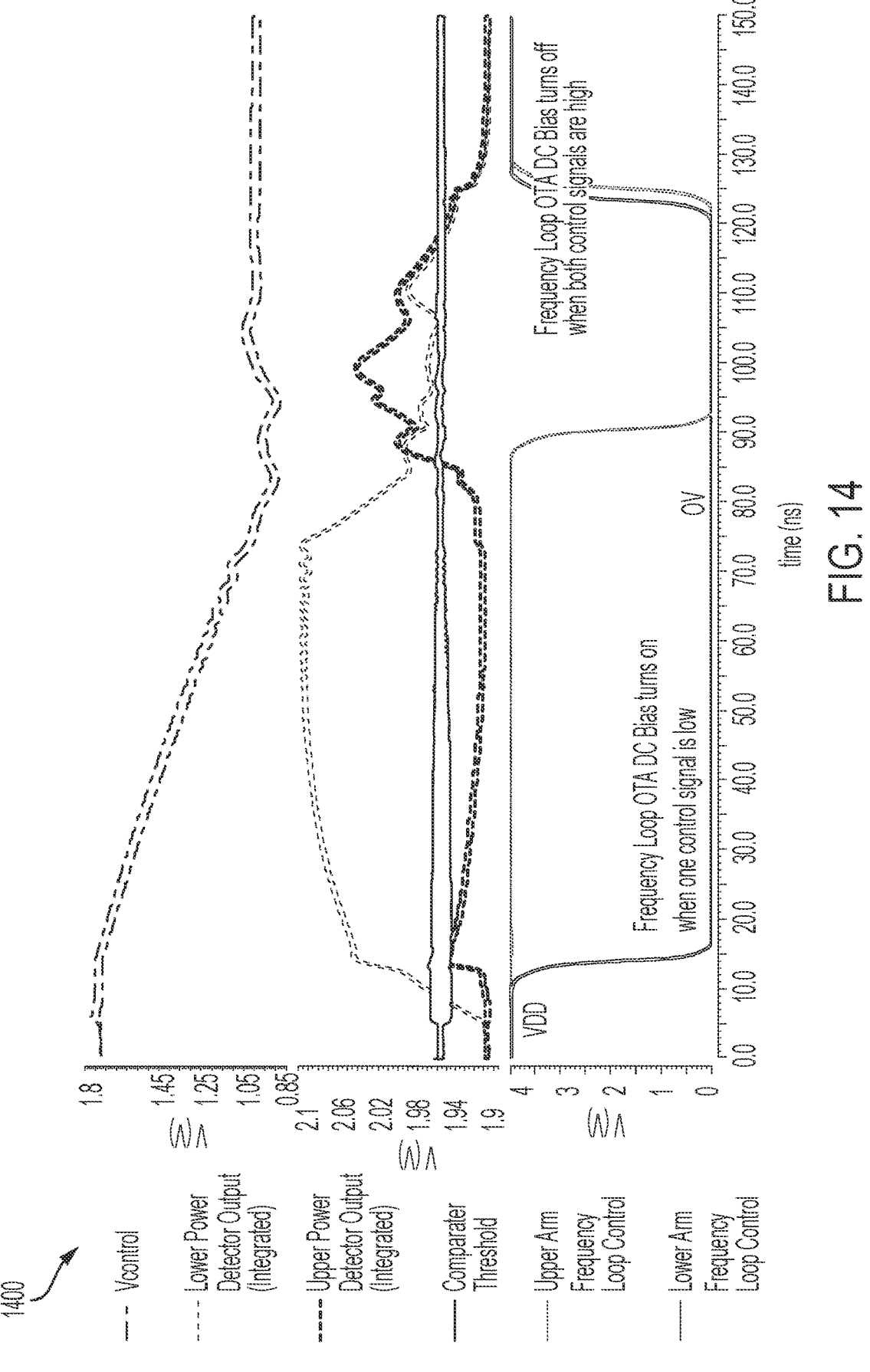
FIG. 14 is a graphical representation of a simulation plot showing the operation of the frequency lock loop according to examples of the present disclosure.

FIG. 14 is a graphical representation of a simulation plot 1400 showing the operation of FLL 104 according to examples of the present disclosure. The integrated power detector output signals serve two purposes. First, they are used as inputs to OTA 120a of FLL 104. When OTA 120a is turned on the integrated power detector outputs are the inputs to OTA 120a that drive the charging/discharging of loop filter 122, and hence the direction of the frequency of VCO 124. Second, they are both inputs to comparator 118a and 118b that is used to turn on/off OTA 120a of FLL 104. When either of power detector 114a and 114b integrated outputs goes above the threshold voltage, the output of comparator 118a or 118b goes to zero. This turns on the Mcontrol devices 1104 of OTA 120a and 120b. This in turn allows FLL 104 to adjust the value of the control voltage of VCO 124. Conversely, when both of the integrated outputs are below the threshold voltage, both comparator outputs are at VDD. This turns off the Mcontrol devices 1104 of OTA 120a and 120b, disabling the FLL 104 so that it will not have any effect on the control voltage of VCO 124. This allows PLL 102 to take over and lock the phases of the input reference signal 106 and the signals of VCO 124.

FIG. 15 shows a method for matching a phase and a frequency of a reference input signal 1500. The method comprises providing a voltage-controlled signal from a voltage-controlled oscillator (VCO), such as VCO 124, as in 1502. The method continues by receiving, by an analog frequency-lock loop (FLL), such as FLL 104, a first part of the reference input signal and a quadrature signal from the VCO, as in 1504. The method continues by determining, by the analog FLL, a frequency difference between the reference input signal, such as reference input signal 106, and the quadrature signal, as in 1506. The method continues by receiving, by an analog phase-look loop (PLL), such as PLL 102, a second part of the reference input signal and an in-phase signal from the VCO, as in 1508. The method continues by determining, by the analog PLL, a phase difference between the reference input signal and the in-phase signal, as in 1510. In some examples, the PLL comprises an analog PLL mixer that outputs signals to a PLL operational transconductance amplifier (OTA). In some examples, the PLL OTA outputs a PLL OTA signal to the VCO to change a frequency or a phase of the quadrature signal or the in-phase signal produced by the VCO. In some examples, the method further comprising determining a direction, by the analog FLL, in which a frequency of the quadrature signal or the in-phase signal produced by the VCO is adjusted to be brought within a frequency locking range of the analog mixer PPL. In some examples, the reference input signal has a frequency range between about 100 GHz to about 1000 GHz. In some examples, the analog FLL comprises a first buffer, a first poly-phase filter, a first power detector, a first integrator, and a first comparator. In some examples, the analog FLL comprises a second buffer, a second poly-phase filter, a second power detector, a second integrator, and a second comparator. In some examples, the analog FLL comprises a FLL OTA that is configured to receive signals from the first integrator, the first comparator, the second integrator, and the second comparator and to provide a FLL OTA output signal to a loop filter. In some examples, the method further comprises providing a loop filter output signal by the loop filter to the VCO to control operation of the VCO.

Figure 16:
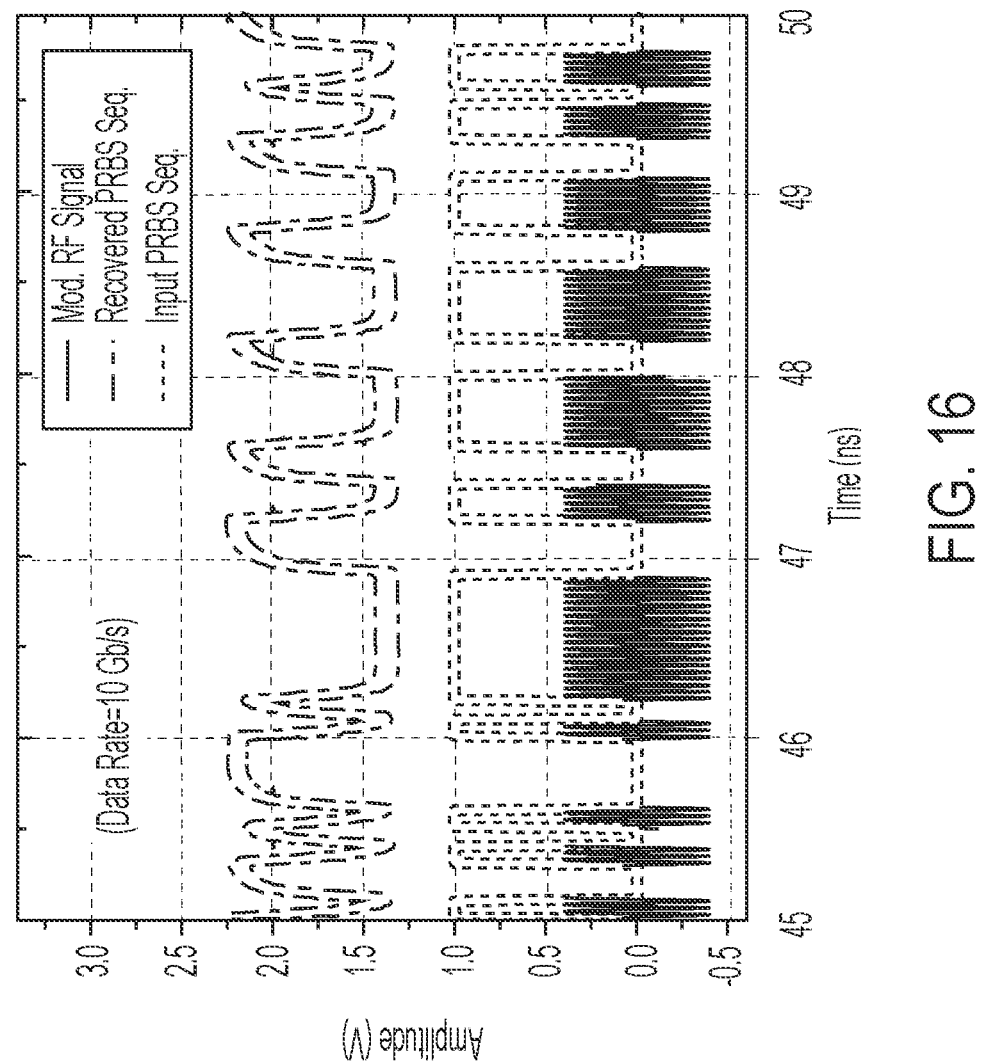
FIG. 16 shows a plot of amplitude vs time for noted signals according to examples of the present disclosure.

FIG. 16 shows a plot of amplitude vs time for a modulated RF signal, a recovered PRBS signal, and an input PRBS signal according to examples of the present disclosure.

Those skilled in the art will recognize improvements and modifications to the preferred embodiments of the present disclosure. All such improvements and modifications are considered within the scope of the concepts disclosed herein.

What is claimed is:

1. A system for matching a phase and a frequency of a reference input signal, the system comprising:

a voltage-controlled oscillator (VCO);

an analog frequency-lock loop (FLL) comprising a first buffer, a first poly-phase filter, a first power detector, a first integrator, and a first comparator and is configured to receive a first part of the reference input signal and a quadrature signal from the VCO and to determine a frequency difference between the reference input signal and the quadrature signal; and an analog phase-look loop (PLL) configured to receive a second part of the reference input signal and an in-phase signal from the VCO and to determine a phase difference between the reference input signal and the in-phase signal.

2. The system of claim 1, wherein the PLL comprises an analog PLL mixer configured to output signals to a PLL operational transconductance amplifier (OTA).

3. The system of claim 2, wherein the PLL OTA outputs a PLL OTA signal to the VCO to change a frequency or a phase of the quadrature signal or the in-phase signal produced by the VCO.

4. The system of claim 2, wherein the analog FLL is configured to determine a direction in which a frequency of the quadrature signal or the in-phase signal produced by the VCO is adjusted to be brought within a frequency locking range of the analog PPL mixer.

5. The system of claim 1, wherein the reference input signal has a frequency range between about 100 GHz to about 1000 GHz.

6. The system of claim 1, wherein the analog FLL comprises a second buffer, a second poly-phase filter, a second power detector, a second integrator, and a second comparator.

7. The system of claim 6, wherein the analog FLL comprises a FLL operational transconductance amplifier (OTA) that is configured to receive signals from the first integrator, the first comparator, the second integrator, and the second comparator and to provide a FLL OTA output signal to a loop filter.

8. The system of claim 7, wherein the loop filter provides a loop filter output signal to the VCO to control operation of the VCO.

9. The system of claim 1, wherein the PLL is configured to perform binary shift keying (BPSK) data demodulation after the PLL is locked.

10. A method for matching a phase and a frequency of a reference input signal, the method comprising:

providing a voltage-controlled signal to a voltage-controlled oscillator (VCO);

receiving, by an analog frequency-lock loop (FLL), a first part of the reference input signal and a quadrature signal from the VCO;

determining, by the analog FLL, a frequency difference between the reference input signal and the quadrature signal;

receiving, by an analog phase-look loop (PLL), a second part of the reference input signal and an in-phase signal from the VCO; and determining, by the analog PLL, a phase difference between the reference input signal and the in-phase signal, wherein the reference input signal has a frequency 300 GHz to about 3000 GHz.

11. The method of claim 10, wherein the PLL comprises an analog PLL mixer that outputs signals to a PLL operational transconductance amplifier (OTA).

12. The method of claim 11, wherein the PLL OTA outputs a PLL OTA signal to the VCO to change a frequency or a phase of the quadrature signal or the in-phase signal produced by the VCO.

13. The method of claim 11, further comprising determining a direction, by the analog FLL, in which a frequency of the quadrature signal or the in-phase signal produced by the VCO is adjusted to be brought within a frequency locking range of the analog PPL mixer.

14. The method of claim 10, further comprising a photo detector configured to detect optical frequencies, wherein the reference input signal has a frequency range between about 10 MHz to above 100 GHz.

15. The method of claim 10, wherein the analog FLL comprises a first buffer, a first poly-phase filter, a first power detector, a first integrator, and a first comparator.

16. The method of claim 15, wherein the analog FLL comprises a second buffer, a second poly-phase filter, a second power detector, a second integrator, and a second comparator.

17. The method of claim 16, wherein the analog FLL comprises a FLL operational transconductance amplifier (OTA) that is configured to receive signals from the first integrator, the first comparator, the second integrator, and the second comparator and to provide a FLL OTA output signal to a loop filter.

18. The method of claim 17, further comprising providing a loop filter output signal by the loop filter to the VCO to control operation of the VCO.

* * * * *